(12) United States Patent
Yeom et al.

(10) Patent No.: US 12,148,626 B2
(45) Date of Patent: Nov. 19, 2024

(54) DRY ETCHING METHOD USING POTENTIAL CONTROL OF GRID AND SUBSTRATE

(71) Applicant: RESEARCH & BUSINESS FOUNDATION SUNGKYUNKWAN UNIVERSITY, Suwon-si (KR)

(72) Inventors: Geun Young Yeom, Seoul (KR); Doo San Kim, Haenam-gun (KR); Yun Jong Jang, Seoul (KR); Ye Eun Kim, Yongin-si (KR); You Jung Gill, Suwon-si (KR); Ki Hyun Kim, Daejeon (KR); Hee Ju Kim, Suwon-si (KR); You Jin Ji, Suwon-si (KR)

(73) Assignee: Research & Business Foundation Sungkyunkwan University, Suwon-si (KR)

( * ) Notice: Subject to any disclaimer, the term of this patent is extended or adjusted under 35 U.S.C. 154(b) by 296 days.

(21) Appl. No.: 17/752,119

(22) Filed: May 24, 2022

(65) Prior Publication Data
US 2022/0375761 A1 Nov. 24, 2022

(30) Foreign Application Priority Data
May 24, 2021 (KR) ........................ 10-2021-0066227

(51) Int. Cl.
*H01L 21/311* (2006.01)
*H01J 37/32* (2006.01)
(Continued)

(52) U.S. Cl.
CPC .. *H01L 21/31116* (2013.01); *H01J 37/32201* (2013.01); *H01J 37/32422* (2013.01); *H01L 21/3065* (2013.01); *H01L 21/32135* (2013.01); *H01L 21/32136* (2013.01); *H01J 2237/334* (2013.01)

(58) Field of Classification Search
None
See application file for complete search history.

(56) References Cited

U.S. PATENT DOCUMENTS

| 10,014,192 | B2 * | 7/2018 | Singh ............... H01J 37/32633 |
| 2011/0192820 | A1 * | 8/2011 | Yeom ............... H01L 21/32137 |
| | | | 156/345.26 |
| 2019/0103270 | A1 | 4/2019 | Yang et al. |

FOREIGN PATENT DOCUMENTS

| KR | 10-2015-0116982 A | 10/2015 |
| KR | 10-2018-0131370 A | 12/2018 |
| KR | 10-2020-0039017 A | 4/2020 |

* cited by examiner

*Primary Examiner* — Jiong-Ping Lu
(74) *Attorney, Agent, or Firm* — NSIP Law

(57) ABSTRACT

A dry etching method includes a first step of adsorbing first radicals into a surface of an etching target, wherein the first radicals are contained in first plasma generated from a plasma generator; and a second step of irradiating ion-beams extracted from second plasma generated from the plasma generator onto the surface of the etching target into which the radicals have been adsorbed, thereby desorbing a surface atomic layer of the etching target, wherein the first step is performed such that: a positive potential greater than a potential of the first plasma is applied to one or two selected from first to third grids, while a ground potential is applied to the rest thereof; and a negative potential equal to or lower than a potential of the third grid is applied to a substrate support structure.

12 Claims, 10 Drawing Sheets

(51) Int. Cl.
*H01L 21/3065* (2006.01)
*H01L 21/3213* (2006.01)

Prior Art

DRY ETCHING METHOD USING POTENTIAL CONTROL OF GRID AND SUBSTRATE

CROSS-REFERENCE TO RELATED APPLICATIONS

This application claims the benefit under 35 U.S.C. § 119(a) of Korean Patent Application No. 10-2021-0066227 filed on May 24, 2021, in the Korean Intellectual Property Office, the entire disclosure of which is incorporated herein by reference for all purposes.

BACKGROUND

1. Field

The present disclosure relates to a dry etching method including atomic layer etching or ion-beam etching, and specifically, to a dry etching method using potential control of a grid and a substrate supporting an etching target thereon.

2. Description of Related Art

In a conventional atomic layer etching process, precise ion energy control is required for atomic-level etching control. For this purpose, an atomic layer etching process using an ion-beam etching apparatus is used. The atomic layer etching process repeats adsorption and desorption processes.

In the adsorption step, only radicals are extracted from plasma and then the radicals are adsorbed onto a surface. In order to adsorb only radicals onto the surface, plasma discharge occurs and then ions and electrons are blocked using a shutter to screen the substrate while the radicals are adsorbed to the surface. However, a large amount of radicals is also lost due to the shutter. Thus, a process time is lengthened to compensate for this loss. In addition, reactive ions and radicals cause contamination of the shutter, which acts as a contamination source in an etching chamber.

In the desorption step, ion-beam etching is performed using an inert gas, and ions are extracted using three grids under a plasma generator. However, when performing etching using ions, the etching is not achieved due to accumulation of charges on the substrate during the etching process of an insulator material.

SUMMARY

This Summary is provided to introduce a selection of concepts in a simplified form that are further described below in the Detailed Description. This Summary is not intended to identify all key features or essential features of the claimed subject matter, nor is it intended to be used alone as an aid in determining the scope of the claimed subject matter.

One purpose of the present disclosure is to provide a dry etching method using potential control of a grid and a substrate in which only radicals may be adsorbed without a shutter in an adsorption step of the etching process, and accumulation of charges of an etching target material may be removed in the desorption step.

Purposes in accordance with the present disclosure are not limited to the above-mentioned purpose. Other purposes and advantages in accordance with the present disclosure as not mentioned above may be understood from following descriptions and more clearly understood from embodiments in accordance with the present disclosure. Further, it will be readily appreciated that the purposes and advantages in accordance with the present disclosure may be realized by features and combinations thereof as disclosed in the claims.

One aspect of the present disclosure provides a dry etching method using an etching apparatus, wherein the apparatus includes a reaction space receiving therein a substrate support structure for supporting an etching target thereon, a plasma generator, and a grid disposed between the reaction space and the plasma generator, wherein the grid includes first to third grids arranged sequentially and vertically, wherein the method comprises: a first step of adsorbing first radicals into a surface of the etching target, wherein the first radicals are contained in first plasma generated from the plasma generator; and a second step of irradiating ion-beams extracted from second plasma generated from the plasma generator onto the surface of the etching target into which the radicals have been adsorbed, thereby desorbing a surface atomic layer of the etching target, wherein the first step is performed such that: a positive potential greater than a potential of the first plasma is applied to one or two selected from the first to third grids, while a ground potential is applied to the rest thereof; and a negative potential equal to or lower than a potential of the third grid is applied to the substrate support structure.

In one implementation, the method further comprises, after the second step, a third step of irradiating electrons generated from the second plasma to the surface of the etching target, thereby neutralizing the surface of the etching target.

In one implementation, the first step is performed such that a potential lower than the first plasma potential or the ground potential is individually applied to each of the first and second grids, and the positive potential is applied to the third grid.

In one implementation, the second step is performed such that a positive potential is applied to the first grid, a negative potential is applied to the second grid, and a ground potential is applied to each of the third grid and the substrate support structure.

In one implementation, the third step is performed such that a ground potential is applied to the first grid, a ground potential or a positive potential is individually applied to each of the second grid and the third grid, and a positive potential is applied to the substrate support structure.

In one implementation, the first plasma is generated using a reactive gas.

In one implementation, the reactive gas includes one selected from a group consisting of H, F, Cl, Br, I, and combinations thereof.

In one implementation, the second plasma is generated using an inert gas.

In one implementation, the inert gas includes one selected from a group consisting of helium (He), neon (Ne), argon (Ar), krypton (Kr) and xenon (Xe).

In one implementation, the second and third steps are repeated.

In one implementation, the dry etching includes atomic layer etching or ion-beam etching.

Effects in accordance with the present disclosure may be as follows but may not be limited thereto.

According to the present disclosure, the adsorption may occur without using the shutter, thereby reducing the loss of radicals and thus shortening a process time, and removing the contamination source in a chamber resulting from shutter contamination which may occur conventionally. In addition, the method according to the present disclosure may effectively solve the accumulation problem of the charges of the etching target material in the desorption step of an atomic layer, and may improve an etching selectivity via charge control of the substrate.

In addition to the effects as described above, specific effects in accordance with the present disclosure will be described together with the detailed description for carrying out the disclosure.

BRIEF DESCRIPTION OF DRAWINGS

FIG. 4 shows an adsorption step (first step) according to an embodiment of the dry etching method according to the present disclosure. FIG. 5 is a view showing a desorption step (second and third steps) according to an embodiment of the dry etching method according to the present disclosure.

FIG. 6A, FIG. 7A, FIG. 8A, and FIG. 9A are graphs showing movement and blocking of electrons, ions, and radicals based on a potential applied to each of the first to third grids and the substrate support structure. FIG. 6B, FIG. 7B, FIG. 8B, and FIG. 9B are graphs showing an etch depth based on an etch time to investigate an etching result under the potential control.

DETAILED DESCRIPTION

Figure 1:
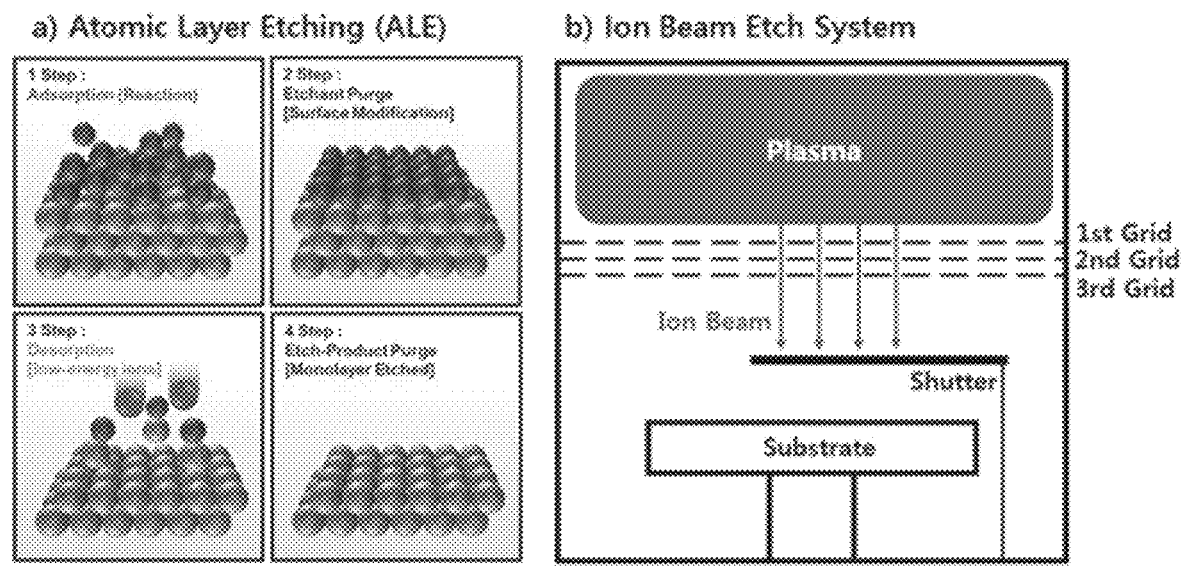
FIGS. 1 to 3 are views showing a conventional etching method.

Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims. Descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The terminology used herein is for the purpose of describing particular embodiments only and is not intended to limit the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entirety of list of elements and may not modify the individual elements of the list. When referring to "C to D", this means C inclusive to D inclusive unless otherwise specified.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In one example, when a certain embodiment may be implemented differently, a function or operation specified in a specific block may occur in a sequence different from that specified in a flowchart. For example, two consecutive blocks may actually be executed at the same time. Depending on a related function or operation, the blocks may be executed in a reverse sequence.

In descriptions of temporal relationships, for example, temporal precedent relationships between two events such as "after", "subsequent to", "before", etc., another event may occur therebetween unless "directly after", "directly subsequent" or "directly before" is not indicated. The features of the various embodiments of the present disclosure may be partially or entirely combined with each other, and may be technically associated with each other or operate with each other.

Figure 2:
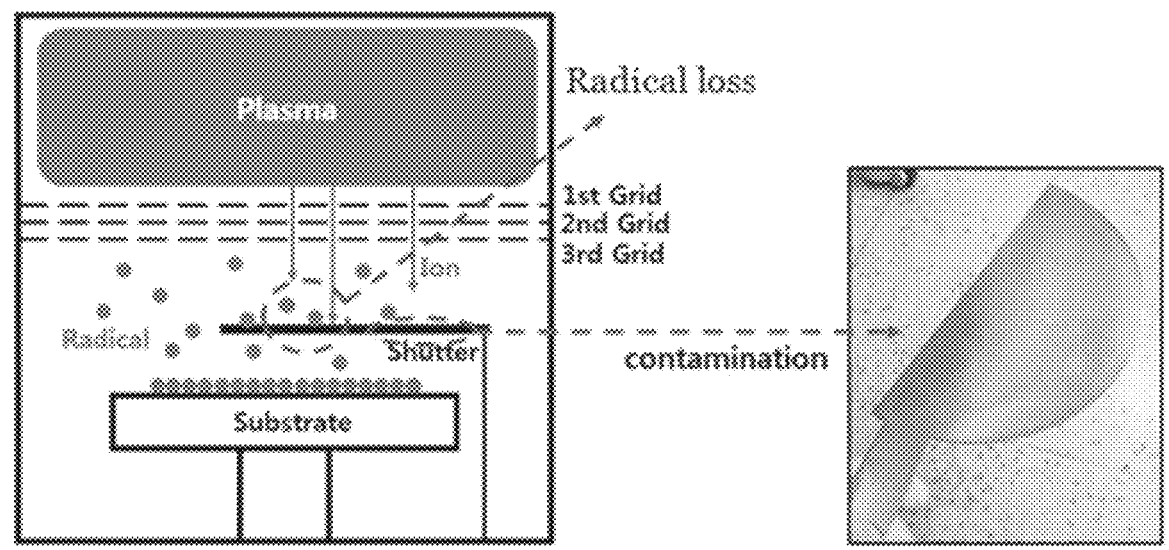
Figure 3:
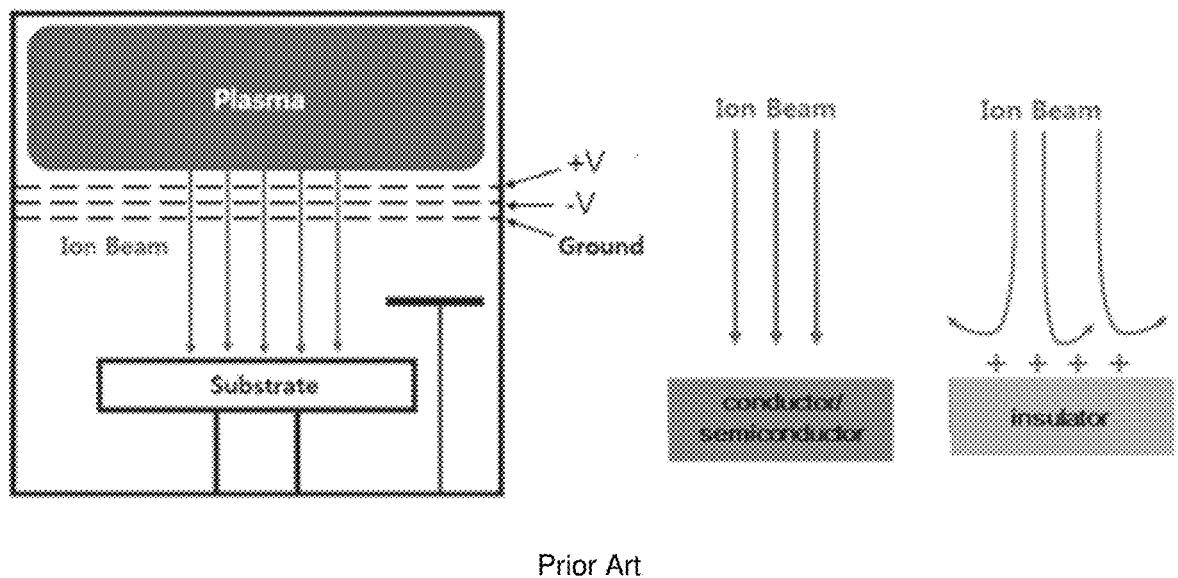

FIGS. 1 to 3 are views showing a conventional etching method.

Referring to FIG. 1, the conventional etching method may be performed by repeating adsorption and desorption processes to etch an etching target material layer by layer at an atomic level.

The adsorption step may adsorb radicals of plasma into a surface layer of the etching target material. For the radical adsorption, remote plasma is generated using reactive gas. At this time, no voltage may be applied to a grid.

Referring to FIG. 2, in this process, radicals and low-energy ions reach the substrate. Thus, a shutter may be used in the adsorption step to prevent damage thereto by the ions. When using the shutter, only non-directional radicals may be adsorbed. In the process of using the shutter, a large amount of radicals may be also lost, and thus the adsorption time may be increased to sufficiently adsorb the radicals to the substrate. This may act as a factor that affects the process time which is an important factor in the atomic layer etching process, and may act as a big problem in applying the atomic layer etching process to the industry. Moreover, in the process of using the shutter, contamination of the shutter may occur due to the reactive ions and radicals. This may act as a contamination source inside an etching chamber. Further, periodic cleaning or replacement of the shutter is required, which incurs additional costs.

Further, referring to FIG. 3, in the desorption step, plasma may be generated using an inert gas, and voltages may be respectively applied to three grids disposed between the substrate and the plasma (positive voltage is applied to the first grid, negative voltage is applied to the second grid, and ground voltage is applied to the third grid) such that ions may be extracted therefrom and energy may be controlled for etching. However, when the insulating material is etched, charges are accumulated on the substrate due to the ions, which causes problems in that etching by the ion-beam is not achieved or an etch profile is deteriorated.

Therefore, the present disclosure provides a novel dry etching method that may solve the problems that occur in the adsorption and desorption steps of the conventional etching method via potential control of the grid and a substrate support structure.

Figure 4:
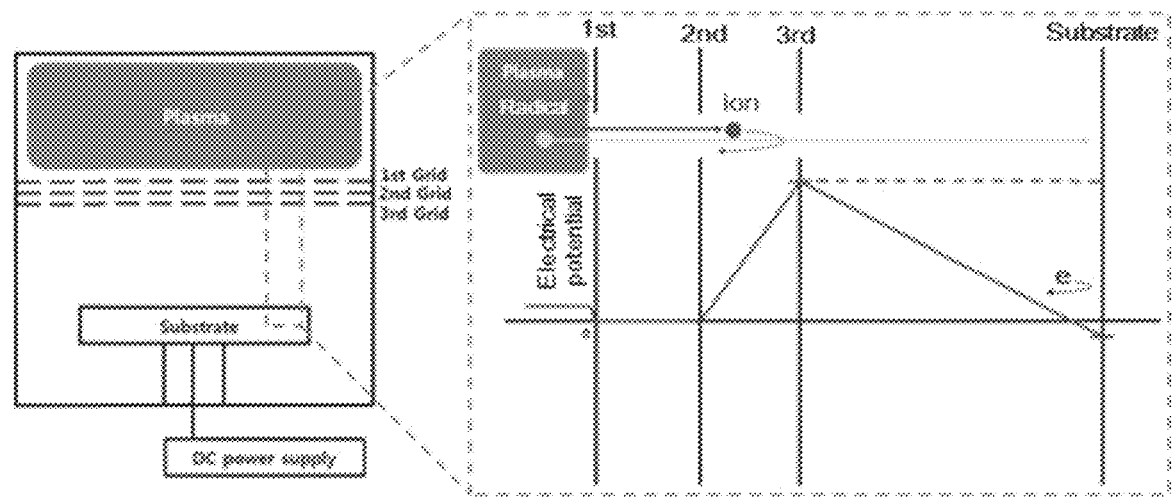
FIGS. 4 and 5 are diagrams for illustrating a dry etching method using the potential control of a grid and a substrate according to the present disclosure.
Figure 5:
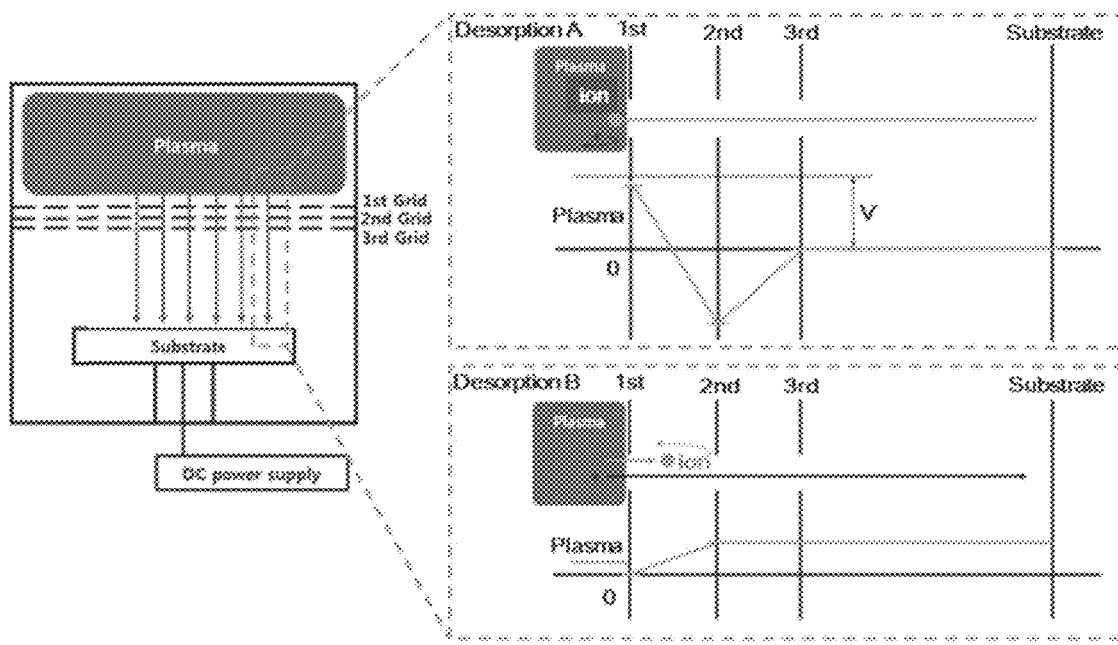

FIGS. 4 and 5 are diagrams for illustrating a dry etching method using the potential control of a grid and a substrate according to the present disclosure. FIG. 4 shows an adsorption step (first step) according to an embodiment of the dry etching method according to the present disclosure. FIG. 5 is a view showing a desorption step (second and third steps) according to an embodiment of the dry etching method according to the present disclosure.

Referring to FIGS. 4 and 5, the dry etching method using the potential control of the grid and the substrate according to the present disclosure may be performed using an etching apparatus including a reaction space in which a substrate support structure supporting an etching target thereon is received, a plasma generator, and a grid disposed between the reaction space and the plasma generator, wherein the grid includes first to third grids sequentially stacked vertically with each other.

Referring to FIG. 4, the dry etching method according to the present disclosure using the etching apparatus includes a first step of adsorbing first radicals contained in first plasma generated from the plasma generator to a surface of the etching target.

The first plasma may be plasma generated by discharging a reactive gas. For example, the reactive gas may be any one selected from a group consisting of H, F, Cl, Br, I, and combinations thereof. Preferably, the reactive gas may be any one selected from $CF_4$, $NF_3$, $Cl_2$, and HBr. The first plasma generated using the reactive gas may contain electrons, ions, radicals, and the like.

In the first step, in order to extract only the radicals contained in the first plasma and adsorb the extracted radicals to the surface of the target to be etched, a positive potential greater than a potential of the first plasma may be applied to one or two selected from the first to third grids and the substrate, while a ground potential may be applied to the rest.

The grid to which the ground potential is applied has a potential lower than the potential of the first plasma and thus may prevent electrons contained in the first plasma from reaching the surface of the etching target. The grid to which the positive potential greater than the potential of the first plasma is applied may prevent the ions contained in the first plasma from reaching the surface of the etching target.

In this regard, in order to prevent a case where all of the electrons contained in the first plasma are not blocked with the first to third grids and thus, some electrons are extracted therefrom and reach the surface of the etching target, the method in accordance with the present disclosure is characterized in that the method include applying a negative potential equal to or lower than that of the third grid to the substrate support structure to block the electrons.

In an embodiment, the first step may be performed by applying the ground potential to the first and second grids and applying the positive potential greater than the plasma potential to the third grid.

In another embodiment, in the first step, a potential lower than the plasma potential or the ground potential may be independently applied to each of the first and second grids, and a positive potential may be applied to the third grid.

Referring to FIG. 5, the method may include the second step of desorbing a surface atomic layer of the etch target by irradiating an ion-beam extracted from second plasma generated from the plasma generator to the surface of the etch target to which the radicals have been adsorbed. In this regard, the ion of the ion-beam may have a low energy.

The second plasma may be a plasma generated using an inert gas. For example, the inert gas may be any one selected from a group consisting of helium (He), neon (Ne), argon (Ar), krypton (Kr), and xenon (Xe). Preferably, the inert gas may be argon (Ar).

The second step is characterized in that it controls the potentials of the first to third grids and the substrate support structure in order to etch the surface of the etching target on which the radicals have been adsorbed using the ion-beam extracted from the second plasma on an atomic layer basis.

In one embodiment, the second step may be performed by applying a positive potential to the first grid, a negative potential to the second grid, and a ground potential to each of the third grid and the substrate support structure.

After the second step is performed, charges as generated due to the ions of the ion-beam in the second step may be accumulated on the surface of the etching target. Therefore, after the second step, the third step of neutralizing the surface of the etching target by irradiating electrons generated from the second plasma to the surface of the etching target may be additionally performed.

For example, in the third step, a ground potential may be applied to the first grid, a ground potential or a positive potential may be applied to each of the second grid and the third grid independently of each other, and a positive potential may be applied to the substrate support structure.

In an embodiment, in order to solve the charge accumulation problem occurring in the second step and to proceed with sufficient etching, the second and third steps may be repeatedly performed. When the second and third steps are repeated, the energy, flux, and time of the extracted ion-beam and electrons may be controlled to control the accumulation of surface charges between a conductor, a semiconductor, and an insulator material such that the etch selectivity therebetween may be increased According to the present disclosure, controlling the potential of the grid and the substrate support structure in the adsorption step may effectively prevent the ions and electrons reaching the substrate so that only electrically neutral radicals may reach the substrate. Further, the shutter used in the prior art is not required such that the loss of radicals due to the the shutter may be reduced. In addition, the dry etching method according to the present disclosure has the advantage that the method may be applied to atomic layer etching as well as ion-beam etching.

Hereinafter, the dry etching method according to the present disclosure will be described in more detail based on specific present examples and comparative examples. However, Examples of the present disclosure are only some embodiments of the present disclosure, and the scope of the present disclosure is not limited to the following examples.

Experimental Example: Evaluation of Adsorption Characteristics Based on Potential Control of Grid and Substrate Support Structure In order to analyze the radical adsorption characteristics based on the potential control of the first to third grids and the substrate support structure according to the present disclosure, in the radical adsorption step of the atomic layer etching, a potential higher than the potential of the first plasma was applied to the third grid while the shutter was not used. Then, the etching result was analyzed based on the potential applied to the third grid. The result is shown in FIG. 6.

Figure 6A:
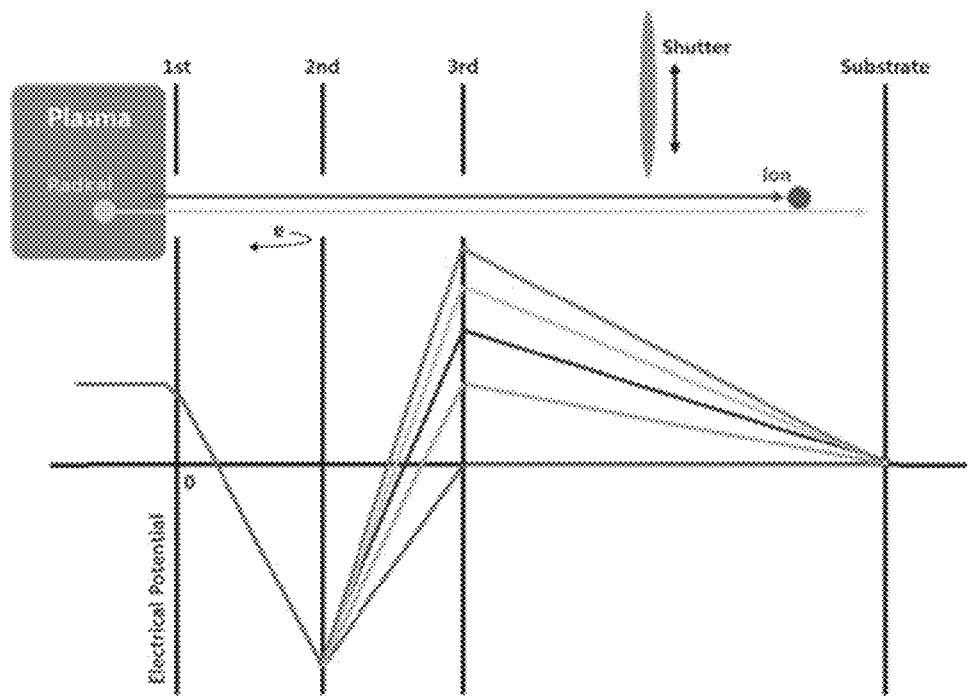
FIGS. 6A, 6B, 7A, 7B, 8A, 8B, 9A, and 9B are graphs for analyzing adsorption characteristics based on potential control of first to third grids and a substrate support structure in the dry etching method according to the present disclosure.
Figure 6B:
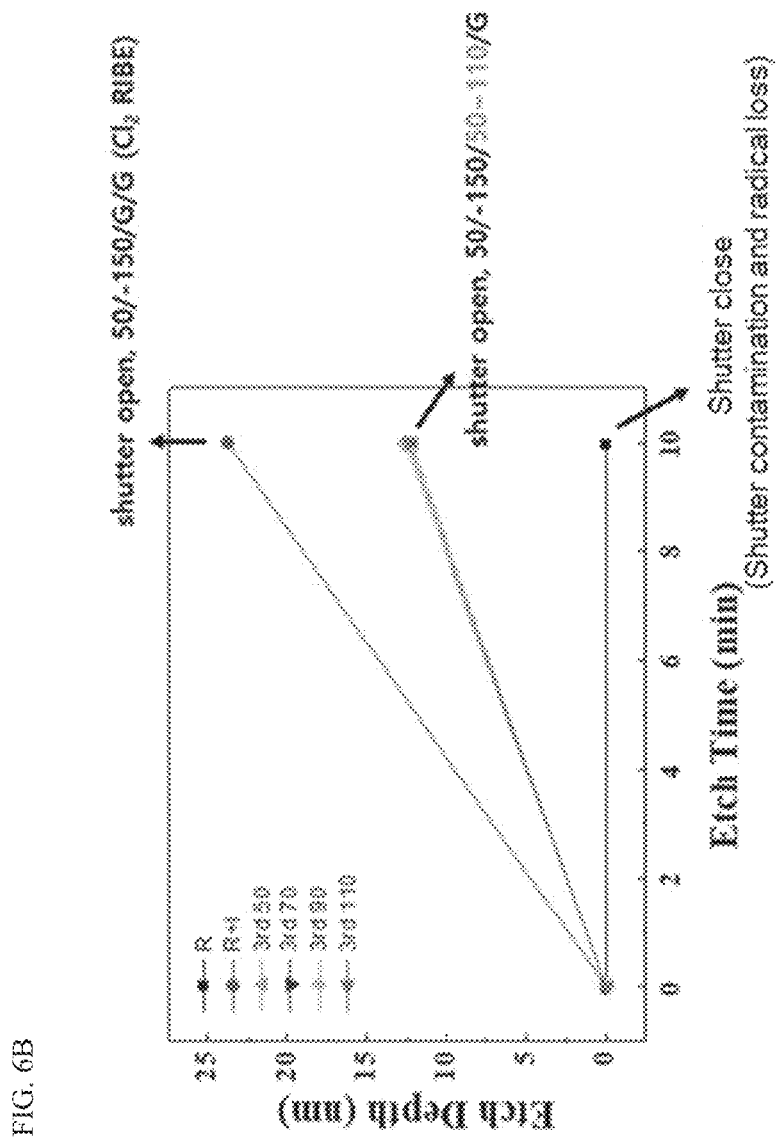

Referring to FIG. 6, it may be identified that in the adsorption step, ions from the first plasma were blocked, but some electrons reached the substrate and contributed to the etching. Thus, it was derived that perfect radical adsorption was not achieved only by controlling the potential of the third grid and without shutter.

Then, the experimental example controlled the potential of the third grid and additionally controlled the potential of the substrate support structure. Then, the radical adsorption characteristics based on the potential control of the grid and the substrate support structure were analyzed. Specifically, in the radical adsorption step of atomic layer etching, 0/0/G/G V, 0/0/20/20 V, and 0/0/20/G V were applied to the first grid/second grid/third grid/substrate support structure, respectively, without using the shutter. The adsorption step was performed for 10 minutes. The results are shown in FIG. 7.

Figure 7A:
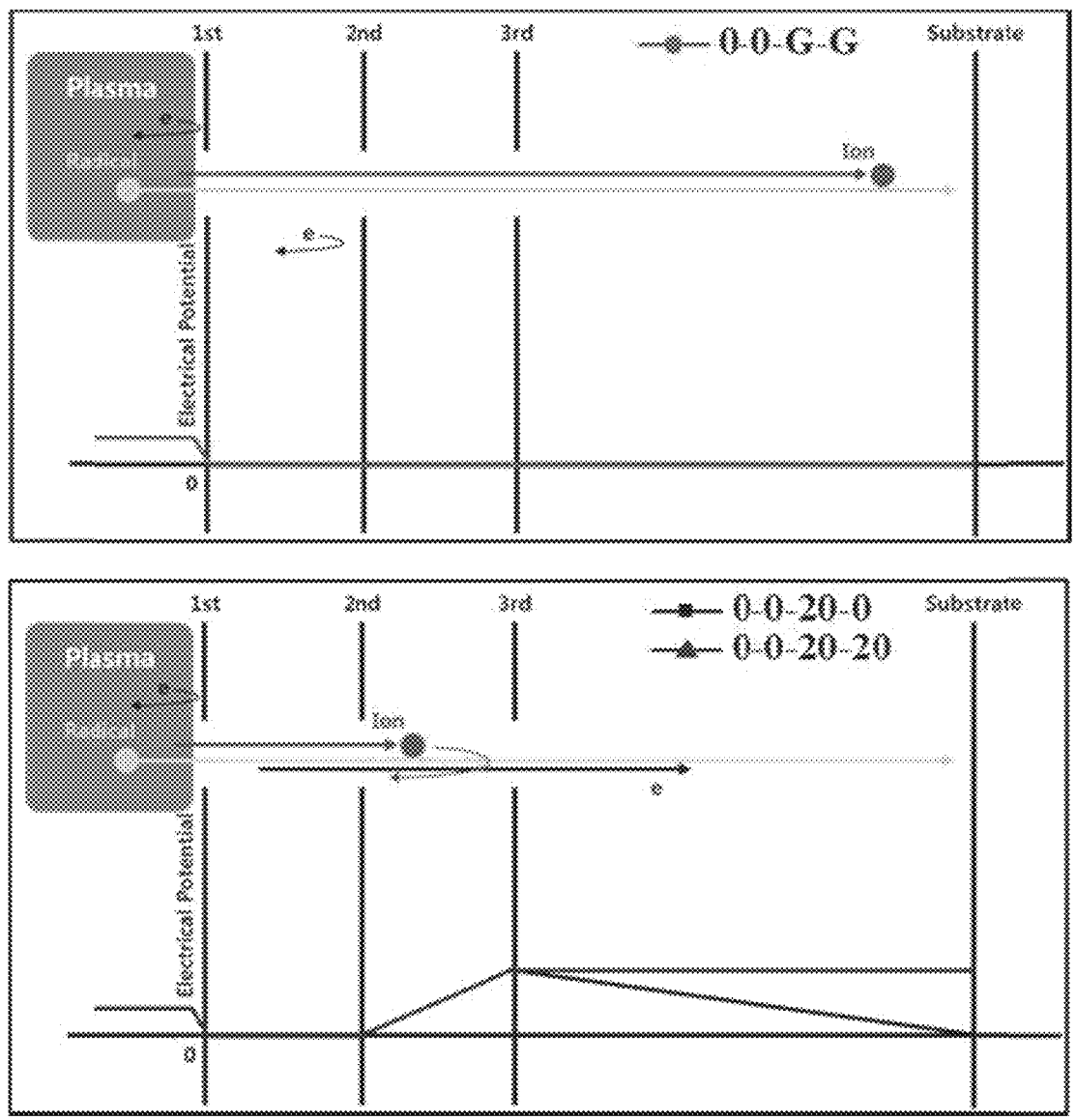
Figure 7B:
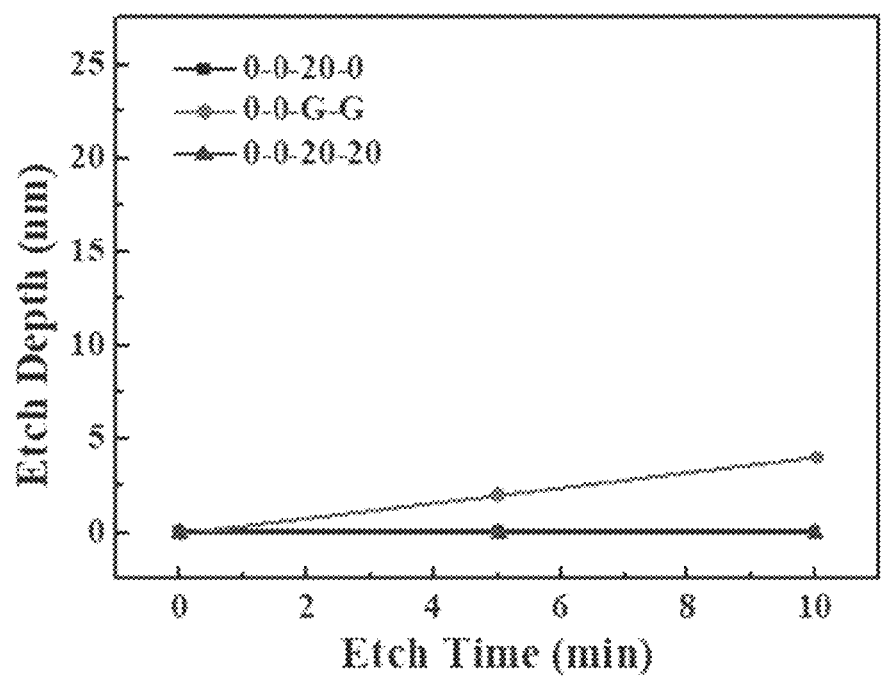

Referring to FIG. 7, it may be identified that when 0/0/G/G V were applied to the first grid/second grid/third grid/substrate support structure, respectively, the etching occurred under Cl radicals and low energy ions. It may be identified that when 0/0/20/20 V were applied to the first grid/second grid/third grid/substrate support structure, respectively, etching did not occur at all. It may be identified that when 0/0/20/G V were applied to the first grid/second grid/third grid/substrate support structure, respectively, etching did not occur at all. However, it was derived that since some electrons may reach the surface (and the substrate support structure) of the etching target, an additional condition to block those electrons is required.

In order to find out the condition under which the electrons are prevented from reaching the surface (and the substrate support structure) of the etching target, the radical adsorption step of the atomic layer etching was carried out by gradually increasing a negative potential value applied to the second grid while the potential value applied to the third grid was fixed to 20 V. The result is shown in FIG. 8.

Figure 8A:
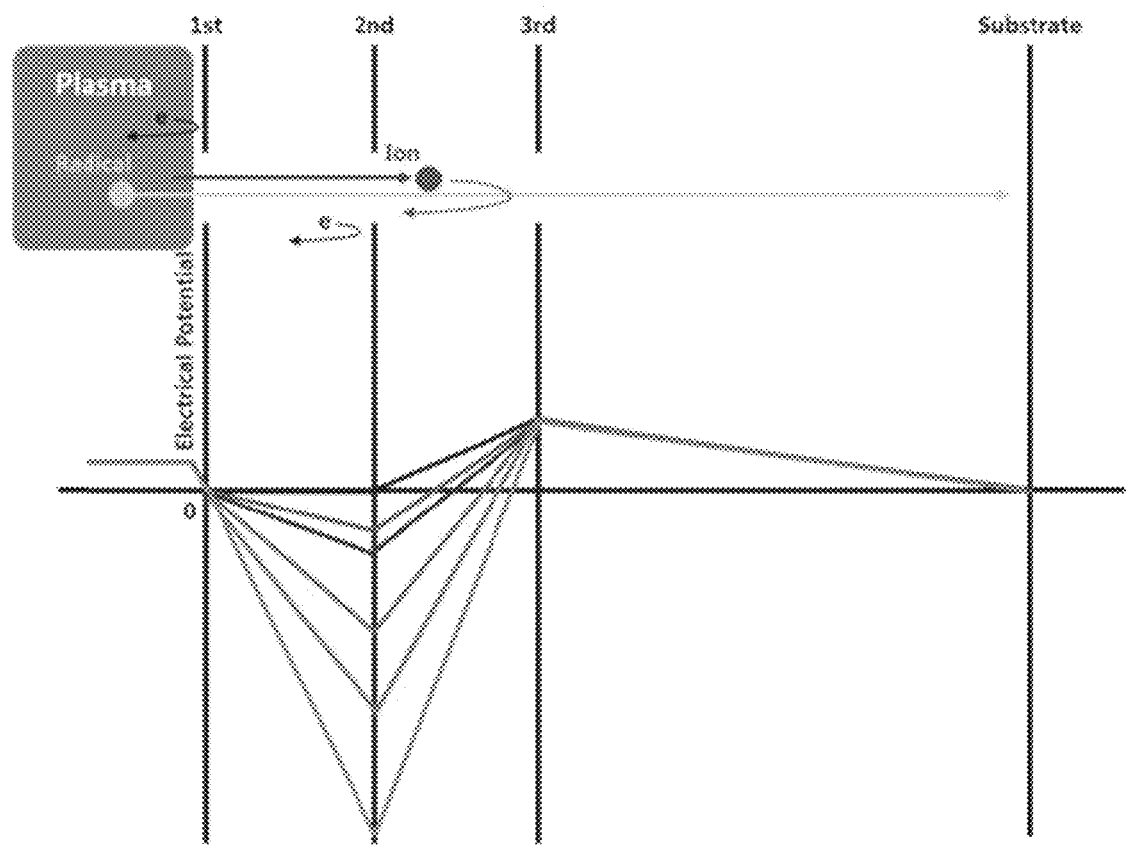
Figure 8B:
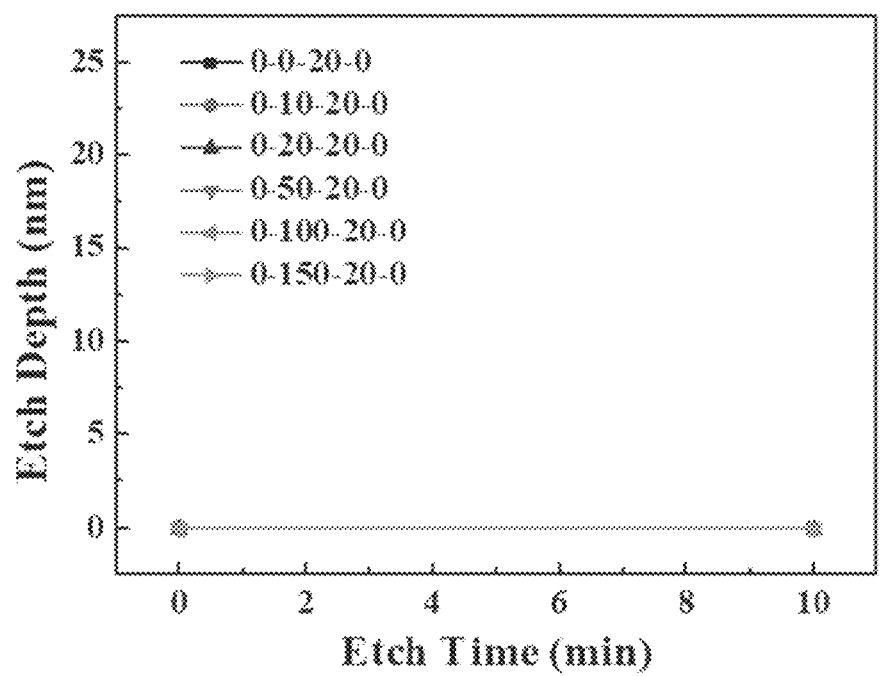

Referring to FIG. 8, it may be identified that when the negative potential value applied to the second grid gradually increases while the potential value applied to the third grid is fixed to 20 V, the etching does not occur at all.

Additionally, a negative potential was applied to the second grid. A difference between potentials of the first and third grids was maintained. A potential applied to the first grid increased. The radical adsorption was analyzed. The result is shown in FIG. 9.

Figure 9A:
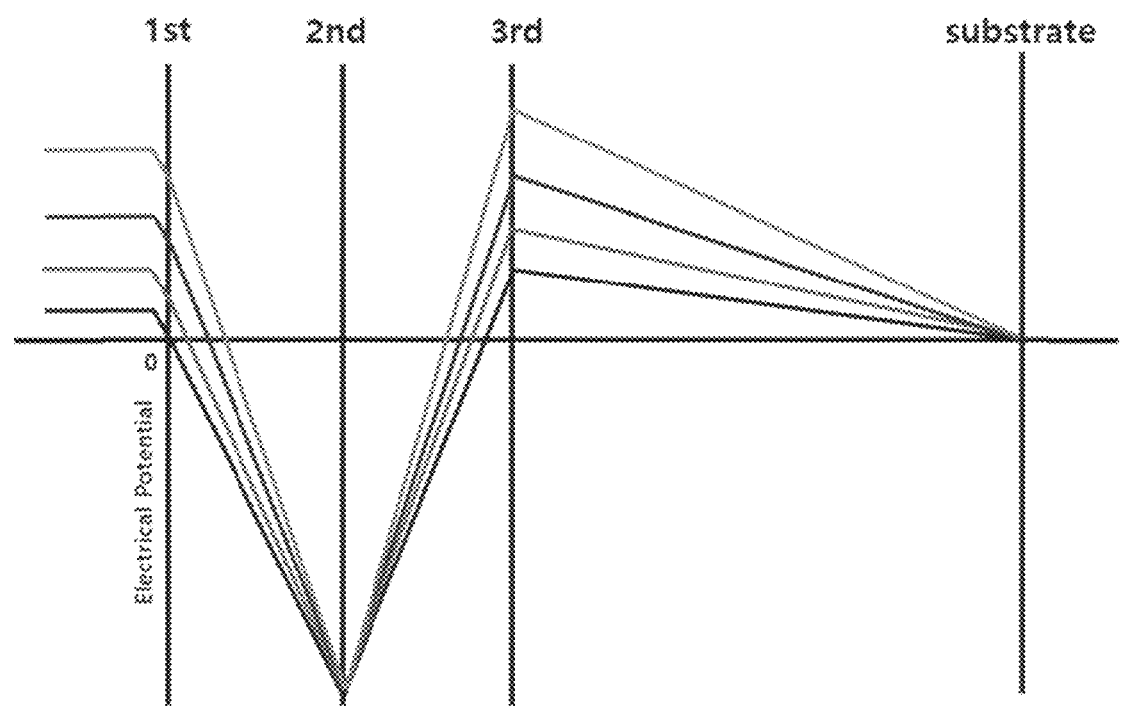
Figure 9B:
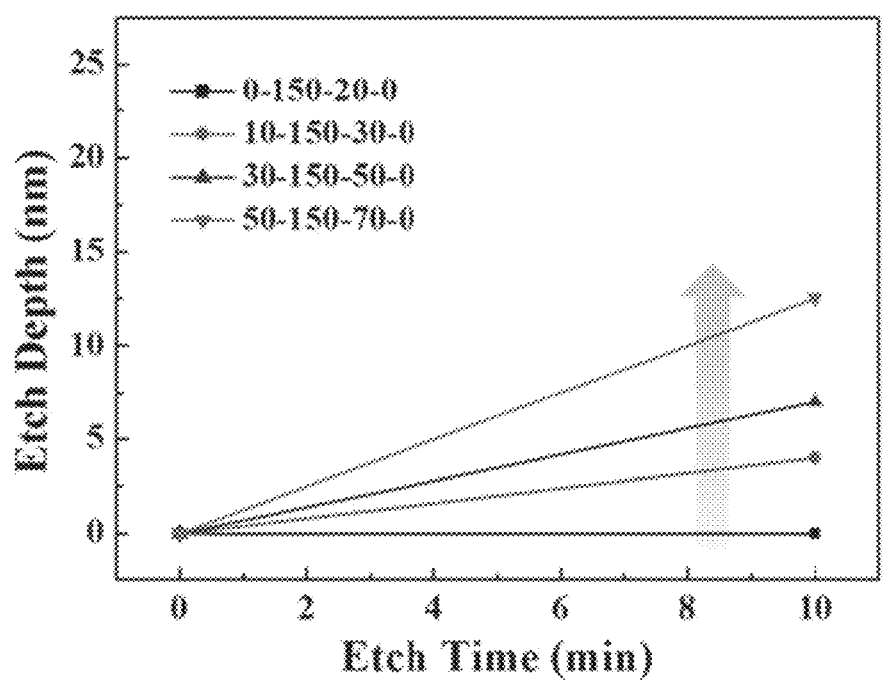

Referring to FIG. 9, it may be identified that only radicals are not extracted from the etching target but the etching takes place thereon. Therefore, in order to extract only the radicals without the shutter, it is necessary to appropriately control the potential. It may be identified that the method according to the present disclosure may extract a larger amount of radicals without using the shutter, compared to the prior art.

A scope of protection of the present disclosure should be construed by the scope of the claims, and all technical ideas within the scope equivalent thereto should be construed as being included in the scope of the present disclosure. Although the embodiments of the present disclosure have been described in more detail with reference to the accompanying drawings, the present disclosure is not necessarily limited to these embodiments. The present disclosure may be implemented in various modified manners within the scope not departing from the technical idea of the present disclosure. Accordingly, the embodiments disclosed in the present disclosure are not intended to limit the technical idea of the present disclosure, but to describe the present disclosure. the scope of the technical idea of the present disclosure is not limited by the embodiments. Therefore, it should be understood that the embodiments as described above are illustrative and non-limiting in all respects. The scope of protection of the present disclosure should be interpreted by the claims, and all technical ideas within the scope of the present disclosure should be interpreted as being included in the scope of the present disclosure.

What is claimed is:

1. A dry etching method using an etching apparatus, wherein the apparatus includes a reaction space receiving therein a substrate support structure for supporting an etching target thereon, a plasma generator, and a grid disposed between the reaction space and the plasma generator, wherein the grid includes first to third grids arranged sequentially and vertically, wherein the method comprises:

a first step of adsorbing first radicals into a surface of the etching target, wherein the first radicals are contained in first plasma generated from the plasma generator; and a second step of irradiating ion-beams extracted from second plasma generated from the plasma generator onto the surface of the etching target into which the radicals have been adsorbed, thereby desorbing a surface atomic layer of the etching target, wherein the first step is performed such that:

a positive potential greater than a potential of the first plasma is applied to one or two selected from the first to third grids, while a ground potential is applied to the rest thereof; and a negative potential equal to or lower than a potential of the third grid is applied to the substrate support structure.

2. The method of claim 1, wherein the method further comprises, after the second step, a third step of irradiating electrons generated from the second plasma to the surface of the etching target, thereby neutralizing the surface of the etching target.

3. The method of claim 2, wherein the third step is performed such that a ground potential is applied to the first grid, a ground potential or a positive potential is individually applied to each of the second grid and the third grid, and a positive potential is applied to the substrate support structure.

4. The method of claim 2, wherein the second and third steps are repeated.

5. The method of claim 1, wherein the first step is performed such that a potential lower than the first plasma potential or the ground potential is individually applied to each of the first and second grids, and the positive potential is applied to the third grid.

6. The method of claim 1, wherein the second step is performed such that a positive potential is applied to the first grid, a negative potential is applied to the second grid, and a ground potential is applied to each of the third grid and the substrate support structure.

7. The method of claim 1, wherein the first plasma is generated using a first gas.

8. The method of claim 7, wherein the first gas includes an element selected from the group consisting of H, F, Cl, Br, and I.

9. The method of claim 1, wherein the second plasma is generated using a second gas.

10. The method of claim 9, wherein the second gas includes one selected from a group consisting of helium (He), neon (Ne), argon (Ar), krypton (Kr) and xenon (Xe).

11. The method of claim 1, wherein the dry etching includes atomic layer etching or ion-beam etching.

12. A dry etching method, comprising
   a first step of adsorbing radicals onto a surface of an etching target, the first step comprising:
   generating a first plasma having a reference potential,
   interposing a first grid, a second grid, and a third grid arranged in sequence between the first plasma and the surface of the etching target, wherein the third grid is arranged between the second grid and the surface of the etching target,
   applying a positive potential to one or two selected from the first grid, the second grid, and the third grid, wherein the positive potential is greater than the reference potential of the first plasma,
   applying a ground potential to a remaining one or more selected from the first grid, the second grid, and the third grid not having the positive potential applied, wherein the ground potential is lower than the reference potential of the first plasma, and
   applying a negative potential to a support structure supporting the etching target, wherein the negative potential is equal to or lower than the potential applied to the third grid; and
   a second step of irradiating ion-beams extracted from a second plasma onto the surface of the etching target, thereby desorbing a surface atomic layer of the etching target.

* * * * *